United States Patent
Trinh et al.

(10) Patent No.: US 7,301,832 B2
(45) Date of Patent: Nov. 27, 2007

(54) COMPACT COLUMN REDUNDANCY CAM ARCHITECTURE FOR CONCURRENT READ AND WRITE OPERATIONS IN MULTI-SEGMENT MEMORY ARRAYS

(75) Inventors: Stephen T. Trinh, San Jose, CA (US); Dixie H. Nguyen, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 187 days.

(21) Appl. No.: 11/266,501

(22) Filed: Nov. 3, 2005

(65) Prior Publication Data

US 2007/0097760 A1 May 3, 2007

(51) Int. Cl.
*G11C 29/00* (2006.01)
(52) U.S. Cl. .......................... 365/200; 365/49
(58) Field of Classification Search ................ 365/200, 365/49, 185.09
See application file for complete search history.

(56) References Cited

U.S. PATENT DOCUMENTS

| | | | |
|---|---|---|---|
| 5,438,546 A * | 8/1995 | Ishac et al. .................. | 365/200 |
| 5,579,265 A * | 11/1996 | Devin ......................... | 365/200 |
| 6,307,787 B1 * | 10/2001 | Al-Shamma et al. .. | 365/185.33 |
| 6,396,749 B2 | 5/2002 | Al-Shamma et al. ....... | 365/200 |
| 6,397,313 B1 | 5/2002 | Kasa et al. .................. | 711/168 |
| 6,504,768 B1 | 1/2003 | Roohparvar et al. ........ | 365/200 |
| 6,870,749 B1 * | 3/2005 | Park et al. .................... | 365/49 |

* cited by examiner

*Primary Examiner*—Anh Phung
(74) *Attorney, Agent, or Firm*—Schneck & Schneck; Thomas Schneck

(57) ABSTRACT

A memory system incorporating redundancy utilizes a content addressable memory to monitor addresses during memory accesses. The content addressable memory provides a pointer to an alternate memory location when a previously determined faulty location is requested. Redundant memory cells are accessed by use of column redundancy information output from the content addressable memory. During a memory access cycle a register in the content addressable memory latches a memory address. The content addressable memory decodes the address and produces column redundancy information as an output. The column redundancy information is latched during a period complementary to the memory access cycle. By utilizing complementary memory access phases to latch memory addresses in contrast with a utilization of column redundancy information, a single set of registers may be used. Additionally, concurrent read and write operations are supported.

9 Claims, 4 Drawing Sheets

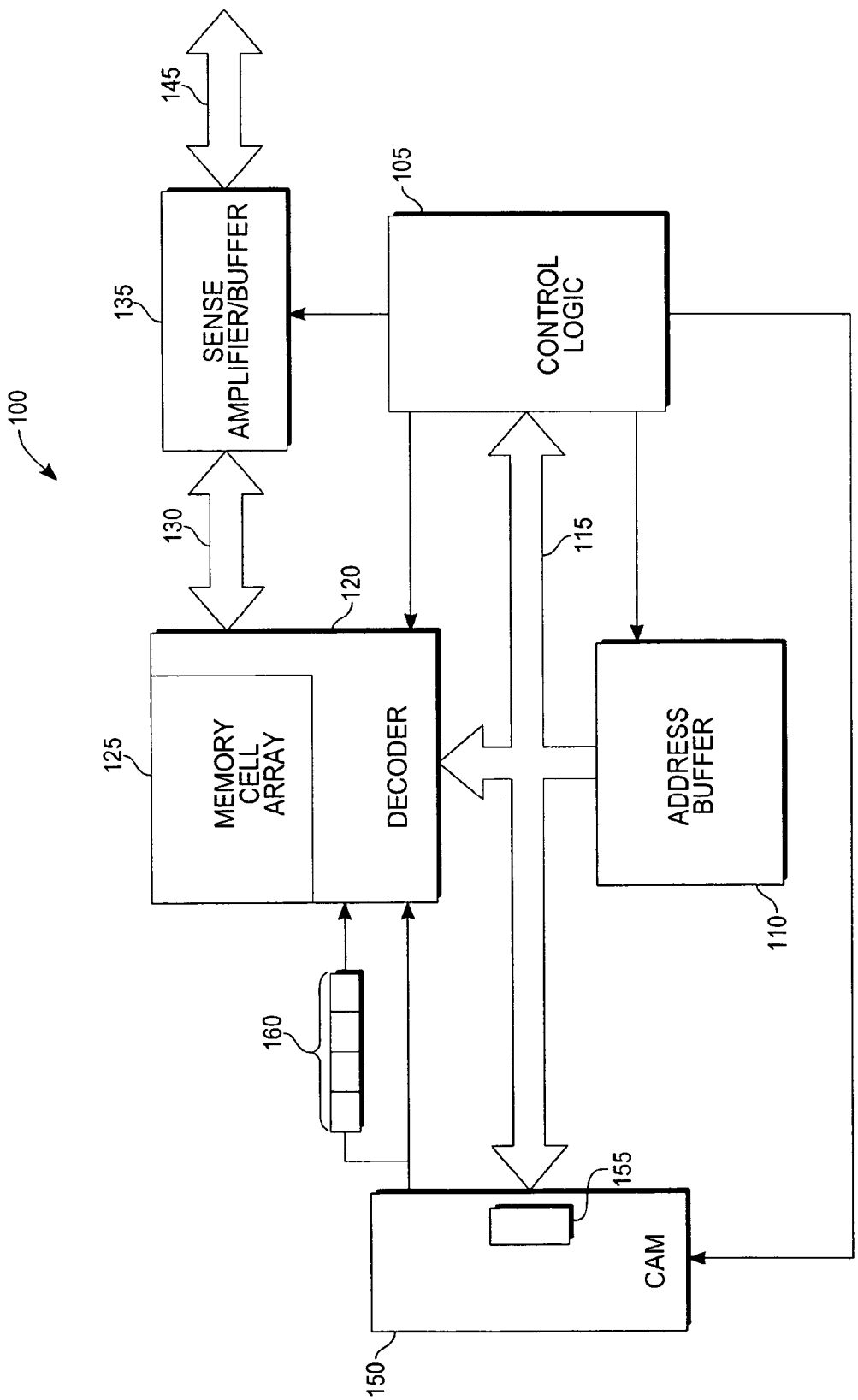
Fig._1

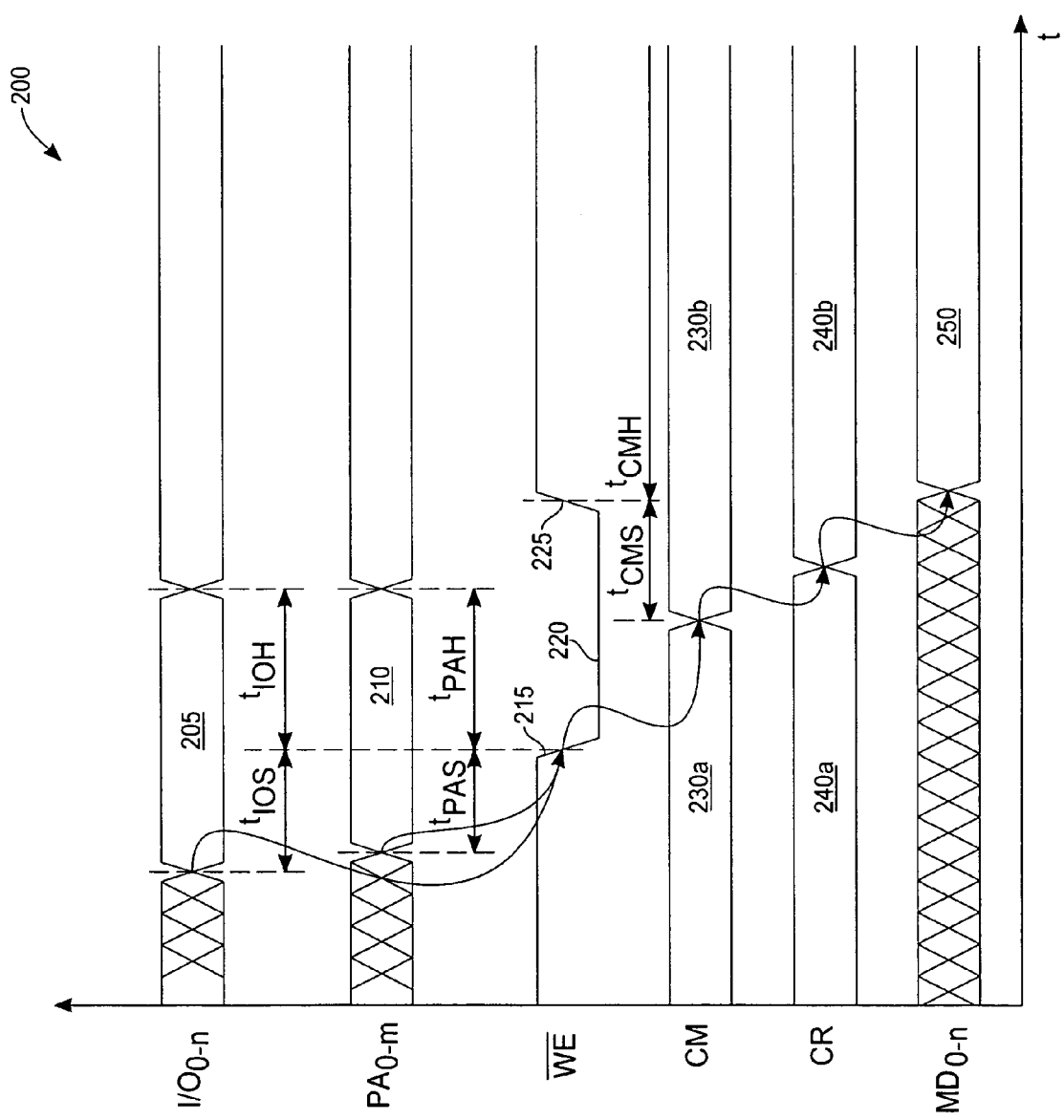
Fig._2

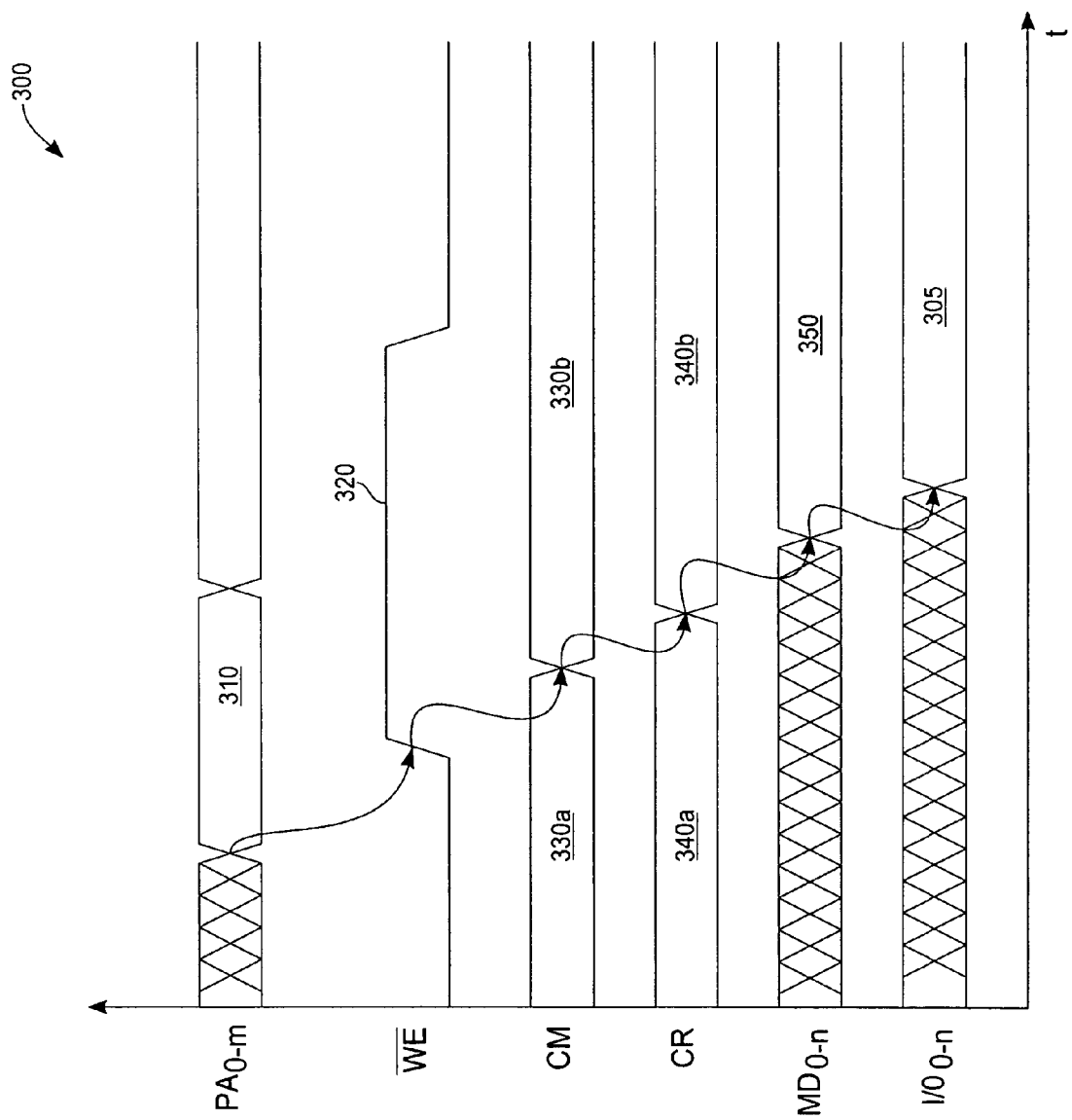
Fig._3

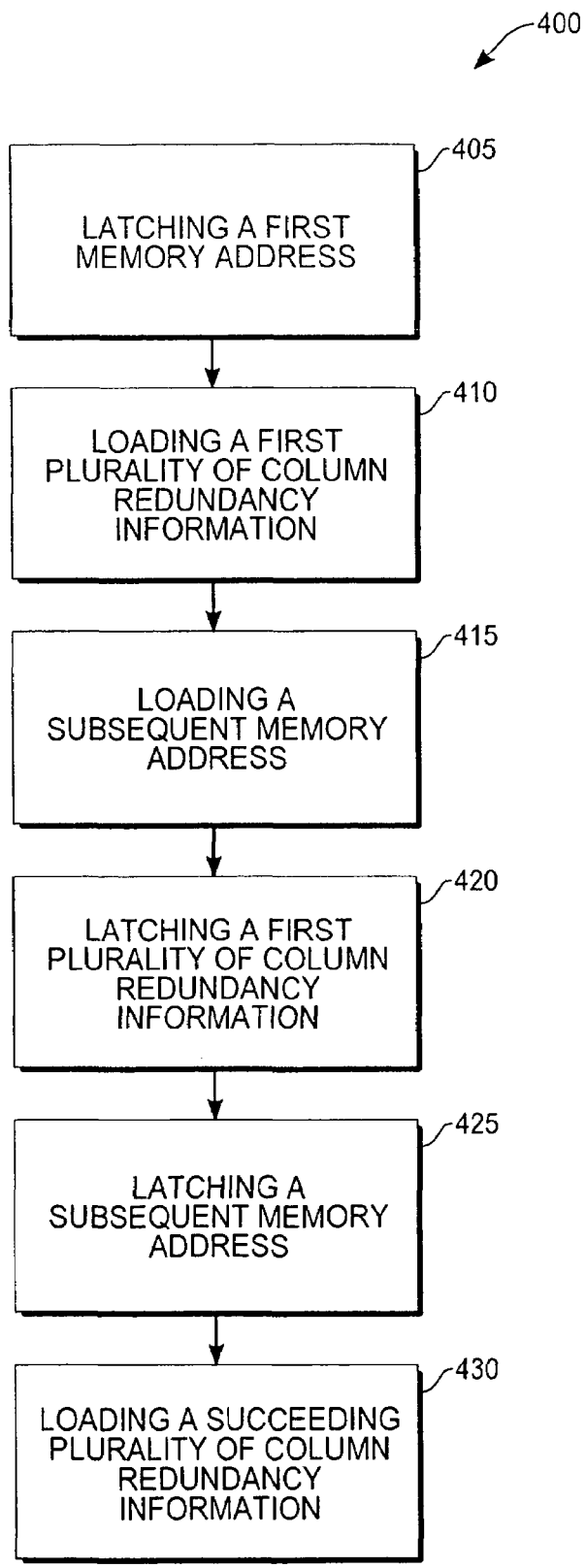
Fig._4

COMPACT COLUMN REDUNDANCY CAM ARCHITECTURE FOR CONCURRENT READ AND WRITE OPERATIONS IN MULTI-SEGMENT MEMORY ARRAYS

TECHNICAL FIELD

The present invention relates to nonvolatile memory circuits. More particularly, the invention relates to a programmable memory device incorporating redundancy in concurrent read and write operations.

BACKGROUND ART

Semiconductor memory devices are typically classified into volatile memory devices and non-volatile memory devices. Volatile memory devices are subdivided into dynamic random access memories (DRAMs) and static random access memories (SRAMs). Non-volatile memory types include mask read-only memories (MROMs), programmable read-only memories (PROMs), erasable programmable read-only memories (EPROMs), and electrically erasable programmable read-only memories (EEPROMs). Additionally, flash EEPROMs are advantageous as mass storage devices because their integration density is high compared with conventional EEPROMs.

Non-volatile semiconductor memories have attained broad utilization due to an ability to retain data within a device, even after power has been suspended. EEPROMs are non-volatile semiconductor memories that possess these abilities and additionally are able to store data by electrically erasing and writing storage devices. This programming process can be repeated over hundreds of thousands of cycles.

Due to the size and complexity of EEPROMs, some memory cell locations may be faulty. Faulty locations may be found during the manufacturing process and in particular, during a final test procedure. Faults are located to a bit column level. Additional memory cells, known as redundant memory locations, are fabricated to provide alternate bit columns. Faulty locations are replaceable by equivalent redundant bit columns within each memory plane. Faulty locations found in manufacturing are programmed into a content addressable memory (CAM) to be decoded as pointers to corresponding alternate locations. In parallel, the CAM and regular decode circuitry receive addresses being used for memory array access. When a faulty memory location address is received, a match to a CAM location is made and a redundant memory location pointer is produced. A memory array decoder uses the pointer to locate redundant bit columns. The redundant memory location is used in place of the faulty one to produce a correct memory output signal.

The content addressable memory is a central part of a redundant memory system. The CAM monitors requested addresses for memory access, compares requested addresses with addresses of predetermined faulty memory cell locations, and produces an alternate memory location pointer. Detection of the faulty memory address and production of the alternate memory pointer occur in time for the redundant location to be used by the rest of the memory system in a manner otherwise identical to the original location.

A memory segment address is latched in an address register during the period necessary for CAM circuitry to decode the column redundancy information pointer. Additionally, a register is utilized after decode of a redundant memory location pointer for a period that the information is required by the rest of the system. For a memory device with many tens or hundreds of segments, multiple sets of addresses and column redundancy information registers are called for in conventional design practices. Multiple sets of registers mean a significant amount of area in the device substrate is dedicated to duplicating the registers at significant cost for fabrication and die area. Good economics would point to avoidance of extensive use of device area in supporting multiple sets of address and redundant column information registers if an alternative might be found. It would be desirable to determine a way of utilizing a single set of registers to provide address and redundant column information storage and be able to support concurrent read and write operations in a memory system.

SUMMARY

A memory system incorporating redundancy utilizes a content addressable memory (CAM) to monitor addresses during memory accesses. The content addressable memory provides a pointer to an alternate memory location when a previously determined faulty location is requested. Redundant memory cells are accessed by use of column redundancy information output data from the content addressable memory. During a memory access cycle a register in the content addressable memory latches a memory address. The content addressable memory decodes the address and upon decoding an address matching a faulty location, produces corresponding column redundancy information as an output data. The column redundancy information is latched during a period that is the complement of the memory access cycle. By utilizing complementary phases to latch memory addresses versus utilize column redundancy information, a single set of registers is used. Additionally, concurrent read and write operations are supported.

BRIEF DESCRIPTION OF DRAWINGS

FIG. 1 is a block diagram of an exemplary nonvolatile memory system incorporating redundancy.

FIG. 2 is a waveform diagram of a write cycle incorporating redundancy corresponding to FIG. 1.

FIG. 3 is a waveform diagram of a read cycle incorporating redundancy corresponding to FIG. 1.

FIG. 4 is a process flow diagram of an exemplary method that may be implemented by the system of FIG. 1.

DETAILED DESCRIPTION

With reference to FIG. 1, an address buffer 110 receives addresses from a system address bus (not shown) in an exemplary nonvolatile memory system 100. The address buffer 110 communicates with the system address bus and a local address bus 115 under the direction of control logic 105. The control logic 105 also connects to a sense amplifier/buffer 135, a decoder 120 of a memory cell array 125, and a content addressable memory (CAM) 150. The local address bus 115 connects to the control logic 105, the decoder 120, and a memory plane address register 155. The memory plane address register 155 is latched within the CAM 150. A column redundancy register 160 connects between the CAM 150 and the decoder 120. The CAM 150 also connects directly to the decoder 120. A bidirectional memory data bus 130 connects the sense amplifier/buffer 135 with the memory cell array 125. The sense amplifier/buffer 135 connects to a remainder of the external system through a bidirectional data bus 145.

The control logic 105 receives a plurality of signal inputs (not shown) from the remainder of the system to directly access the exemplary nonvolatile memory system 100. The control logic 105 communicates with the address buffer 110 to control receipt and transmittal of addresses with appropriate timing on the local address bus 115. A memory cell array address received by the address buffer 110 is transmitted to the decoder 120 and mirrored to the control logic 105. The decoder 120 uses the address to select bit columns (not shown) within the memory cell array 125. The decoder 120 additionally connects the bit columns within the memory cell array 125 to the memory data bus 130.

The bidirectional memory data bus 130 connects to the bit columns from output terminals of the decoder 120 to the sense amplifier/buffer 135. A sense amplifier portion of the sense amplifier/buffer 135 is connected to the memory cell array 125 for reading of data stored at memory cell locations (not shown) along the bit columns. A buffer portion of the sense amplifier/buffer 135 is connected through the bidirectional memory data bus 130 to the bit columns of the memory cell array 125 for writing data into memory cell locations. Data to and from the remainder of the system are communicated with the sense amplifier/buffer 135 across the bidirectional data bus 145. The control logic 105 is connected to the decoder 120 and the sense amplifier/buffer 135 to coordinate read and write operations.

The CAM 150 provides column redundancy information to make use of redundant bit columns, for example, within the memory cell array 125. Redundant bit columns may be placed in a number of alternate locations (not shown), such as in a separate memory cell array or in an alternate device, which would be able to communicate with the memory subsystem and the bidirectional data bus 145. In the CAM 150 the memory plane address register 155 receives addresses from the local address bus 115 concurrent with the decoder 120. If the target address is in a properly functioning bit column the decoder 120 accesses the bit column and provides a signal path from the bit column to an output terminal of the memory cell array 125. If the target address is in a faulty bit column the CAM 150 intercedes in address decoding to provide the redundant bit column.

For each memory access the memory plane address register 155 latches some or all of the bit positions of the local address bus 115. For instance, in a multi-segment memory array the memory plane address register 155 latches only as many high order address bits as are required to address the number of segments within the device organization of the memory array. In the present exemplary context, the number of high order address bits necessary to address the number of segments within the memory array is a memory plane address or simply a plane address. A plane address received during a memory access is sufficient to decode a single word line (not shown) within the CAM 150. For example, a 128 megabit flash memory device may be organized into 32 memory planes and utilize five bits of memory plane address data within the memory plane address register 155.

An address latched in the memory plane address register 155 is applied to the decode circuitry (not shown) of the CAM 150. Only in the case of a faulty bit column does the address decode a word line of the CAM 150. A word line of the CAM 150 contains a predetermined amount of column redundancy information. For example, a single word line in the CAM 150 may contain four fields of memory bit locations. The bits within a field together form a pointer. Pointer contents are configured to provide a link to redundant bit columns, which may be, for example, within the memory cell array 125.

Each field of column redundancy information provides a pointer or link for the decoder 120 to reroute access from a faulty location to a redundant bit column. A link may form an alternate address to a redundant bit column. The alternate address may be a direct replacement of a faulty address. As a direct replacement, the alternate address is formed in the same format as a regular address. Alternatively, the column redundancy information may be composed of links based on an alternate mapping scheme for the decoder 120 to locate redundant bit columns. The column redundancy information is latched in the column redundancy register 160.

With reference to FIG. 2 as well as continued reference to FIG. 1, bidirectional bus signals $I/O_{0-n}$ become stable input data 205 on the bidirectional data bus 145 (FIG. 1) in an exemplary write cycle waveform diagram 200. The stable input data 205 occur prior to a falling edge 215 of a write enable bar signal $\overline{WE}$ by a period defined as an I/O setup time $t_{IOS}$. The stable input data 205 remain in a stable condition past the falling edge 215 of the write enable bar signal $\overline{WE}$ for a period defined as an I/O hold time $t_{IOH}$. The I/O setup and hold times $t_{IOS}$, $t_{IOH}$ allow the sense amplifier/buffer 135 to latch data from the bidirectional data bus 145 in preparation for writing to the memory cell array 125.

A plane address $PA_{0-m}$ becomes stable address data 210 at a point prior to the falling edge 215 of the write enable bar signal $\overline{WE}$. This point is defined as a plane address setup time $t_{PAS}$. The condition of stable address data 210 continues past the falling edge 215 of the write enable bar signal $\overline{WE}$ for a period defined as a plane address hold time $t_{PAH}$. The plane address setup and hold times $t_{PAS}$, $t_{PAS}$ allow the memory plane address register 155 (FIG. 1) to latch plane addresses. The memory plane address register 155 latches a portion of high order plane address bits during the plane address setup and hold times $t_{PAS}$, $t_{PAS}$ allowing time for the CAM 150 to decode column redundancy information 230b for an individual memory plane.

A write cycle is defined by the period when the write enable bar signal $\overline{WE}$ is low 220. During the write cycle, the CAM 150 decodes the portion of the plane address latched in the memory plane address register 155 to determine a single word line and produce a present set of column redundancy information 230b. The column redundancy register 160 receives the present set of column redundancy information 230b subsequent to a word line decoding by the CAM 150. Through a direct connection to a plurality of content addressable memory output terminals the column redundancy register 160 monitors and receives the column redundancy information 230b from the decoded word line as a CAM output signal CM during the write cycle.

The column redundancy register 160 latches the CAM output signal CM at a rising edge 225 of the write enable bar signal $\overline{WE}$. The period that the CAM output signal CM remains stable for latching prior to the rising edge 225 of the write enable bar signal $\overline{WE}$ is defined as the CAM setup time $t_{CMS}$. The period that the CAM output signal CM remains stable for latching after the rising edge 225 of the write enable bar signal $\overline{WE}$ is defined as the CAM hold time $t_{CMH}$. The CAM setup and hold times $t_{CMS}$, $t_{CMH}$ are the setup and hold times of latch elements (not shown) in the column redundancy register 160. The present column redundancy information decode cycle replaces a previous set of column redundancy information 230a latched in the column redundancy register 160 in a previous memory access cycle. The CAM output signal CM comes from the column redundancy register 160 and is communicated to the decoder 120 of the memory cell array 125.

In a memory access cycle utilizing redundancy, the present set of column redundancy information 230b. latched in the column redundancy register 160 is propagated to the decoder 120. The decoder 120 utilizes the present set of column redundancy information 230b. to decode a link to alternate memory locations and produce redundant bit column output signals CR. The present set of column redundancy information 230b, for example, is decoded to produce a present set of redundant bit column output signals 240b. The present set of redundant bit column output signals 240b replaces a previous set of redundant bit column output signals 240a as the present redundant bit column configuration. The present set of redundant bit column output signals 240b is utilized to supply memory data at the memory cell array output terminals $MD_{0-n}$. Stable memory data 250 are produced at the memory cell array output terminals $MD_{0-n}$ after a propagation delay time from the present set of redundant bit column output signals 240b.

With reference to FIG. 3 and continued reference to FIG. 1, a plane address $PA_{0-m}$ is applied on the local address bus 115 (FIG. 1) in an exemplary read cycle waveform diagram 300. A read cycle is defined by the period the write enable bar signal $\overline{WE}$ is high 320. During the read cycle, the CAM 150 decodes a portion of the plane address. A single word line is determined and when decoded by the CAM 150, produces a present set of column redundancy information 330b at a plurality of output terminals of the CAM 150. The present set of column redundancy information 330b is communicated directly to the decoder 120 of the memory cell array 125 subsequent to the word line decoding. The present column redundancy information decode cycle replaces a previous set of column redundancy information 330a from a previous decode cycle with the present set of column redundancy information 330b.

In a memory access cycle utilizing redundancy, the present set of column redundancy information 330b is propagated to the decoder 120. The decoder 120 utilizes the present set of column redundancy information 330b to decode a link to alternate memory locations and produce redundant bit column output signals CR. The present set of column redundancy information 330b, for example, is decoded to produce a present set of redundant bit column output signals 340b. The present set of redundant bit column output signals 340b replaces a previous set of redundant bit column output signals 340a as the present redundant bit column configuration. The present set of redundant bit column output signals 340b is utilized to supply memory data at the memory cell array output terminals $MD_{0-n}$. Stable memory data 350 are produced at the memory cell array output terminals $MD_{0-n}$ after a propagation delay time from the present set of redundant bit column output signals 340b. Bidirectional bus signals $I/O_{0-n}$ become stable output data 305 on the bidirectional data bus 145 (FIG. 1) after a propagation delay time from the memory cell array output terminals $MD_{0-n}$ through the sense amplifier/buffer 135.

With reference to FIG. 4, latching 405 a first memory address commences an exemplary process flow diagram 400 of a method of utilizing a nonvolatile memory system incorporating redundancy. The process continues with loading 410 a first plurality of column redundancy information followed by loading 415 a subsequent memory address. A next step is latching 420 a first plurality of column redundancy information followed by latching 425 a subsequent memory address. The exemplary process flow 400 concludes with loading 430 a subsequent plurality of column redundancy information.

Although exemplary representations of memory systems incorporating redundancy have been presented, one skilled in the art appreciates that the essential characteristics presented apply to other memory systems of different organizations with different approaches to implementing links to redundancy information. For instance, a memory device has been described as being a 128 megabit flash memory organized with 32 memory planes. One skilled in the art would readily conceive of many alternate memory devices of varying capacity, memory plane organizations, and fundamental storage technology. For instance, a memory device may be a static RAM (random access memory), a dynamic RAM, a PROM (programmable read only memory), or an EPROM (electrically programmable read only memory) and still readily incorporate memory address monitoring and mapping to alternate addresses or links to redundant memory segments. While address and redundant column information registers have been portrayed as collections of latches, one skilled in the art recognizes that flip-flops, for instance, may be used for similar functionality. While the operation of a content addressable memory has been depicted as being triggered by rising and falling edges of a write enable signal, one skilled in the art would readily understand the use of an output enable or chip enable signal being the source of an equivalent trigger mechanism. For these reasons, the specification and drawings are to be taken in an illustrative rather than restrictive sense.

What claimed is:

1. A redundant memory system comprising:
   a memory address register capable of storing a memory address and configured to store the memory address during a first period of time;
   a column redundancy register capable of storing a plurality of column redundancy information and configured to store the plurality of column redundancy information during a second period of time;
   a content addressable memory capable of receiving a memory address and providing a plurality of column redundancy information; and
   a memory cell array coupled to the content addressable memory and configured to provide concurrent read and write capabilities from a plurality of memory cell locations or a plurality of redundant memory cell locations.

2. The redundant memory system of claim 1, wherein the column redundancy register and the memory address register are each comprised of a set of latches.

3. The redundant memory system of claim 1, wherein the memory address register and the column redundancy register provide concurrent reading and writing capabilities by retaining a first decoded set of column redundancy information in the column redundancy register while decoding a second set of column redundancy information in the content addressable memory.

4. A redundant memory system comprising:
   a memory address register capable of storing an address of a memory segment and configured to store the memory segment address during a first period of time;
   a column redundancy register capable of storing a plurality of addresses to redundant bit columns and configured to store the plurality of addresses to redundant bit columns during a second period of time;

a content addressable memory capable of receiving a memory segment address and providing an alternate memory address of redundant memory cell locations; and a memory cell array coupled to the content addressable memory and configured to provide concurrent read and write capabilities from a plurality of memory cell locations or a plurality of redundant memory cell locations.

5. The redundant memory system of claim 4, wherein the column redundancy register and the memory address register are each comprised of a set of latches.

6. The redundant memory system of claim 4, wherein the memory address register and the column redundancy register provide concurrent reading and writing capabilities by retaining a first decoded alternate memory address of redundant memory cell locations in the column redundancy register while decoding a second alternate memory address of redundant memory cell locations in the content addressable memory.

7. A redundant memory system comprising:

a memory address storage means for storing a memory address during a first period of time;

a column redundancy information storage means for storing a plurality of column redundancy information during a second period of time;

a content addressable storage means for receiving a memory address and providing a plurality of column redundancy information; and a memory cell array storage means for providing concurrent read and write capabilities from a plurality of memory cell locations or a plurality of redundant memory cell locations.

8. The redundant memory system of claim 7, wherein the column redundancy information storage means and the memory address storage means are each comprised of a set of latches.

9. The redundant memory system of claim 7, wherein the memory address storage means and the column redundancy information storage means provide concurrent reading and writing capabilities by retaining a first decoded set of column redundancy information in the column redundancy information storage means while decoding a second set of column redundancy information in the content addressable storage means.

* * * * *